(12) United States Patent
Cheah et al.

(10) Patent No.: US 10,014,710 B2
(45) Date of Patent: Jul. 3, 2018

(54) FOLDABLE FABRIC-BASED PACKAGING SOLUTION

(71) Applicant: INTEL CORPORATION, Santa Clara, CA (US)

(72) Inventors: Bok Eng Cheah, Bayan Lepas (MY); Jackson Chung Peng Kong, Tanjung Tokong (MY); Kooi Chi Ooi, Glugor (MY); Mark A. Schaecher, Phoenix, AZ (US); Teong Guan Yew, Bagan Serai (MY); Eng Huat Goh, Ayer Itam (MY)

(73) Assignee: Intel Corporation, Santa Clara, CA (US)

( * ) Notice: Subject to any disclaimer, the term of this patent is extended or adjusted under 35 U.S.C. 154(b) by 276 days.

(21) Appl. No.: 14/964,466

(22) Filed: Dec. 9, 2015

(65) Prior Publication Data

US 2017/0170676 A1    Jun. 15, 2017

(51) Int. Cl.
| | |
|---|---|
| *H02J 7/02* | (2016.01) |
| *H02J 50/10* | (2016.01) |
| *H01L 21/48* | (2006.01) |
| *H01L 21/56* | (2006.01) |
| *H01L 25/00* | (2006.01) |
| *H01L 23/31* | (2006.01) |

(52) U.S. Cl.
CPC .......... *H02J 7/025* (2013.01); *H01L 21/4853* (2013.01); *H01L 21/565* (2013.01); *H01L 21/568* (2013.01); *H01L 23/3121* (2013.01); *H01L 25/50* (2013.01); *H02J 50/10* (2016.02)

(58) Field of Classification Search
CPC .......................... H01L 23/3121; H01L 21/565
See application file for complete search history.

(56) References Cited

U.S. PATENT DOCUMENTS

| | | | | |
|---|---|---|---|---|
| 7,358,615 | B2 * | 4/2008 | Heck ....................... | H01L 23/13 257/776 |
| 8,110,441 | B2 * | 2/2012 | Chandra ............... | H01L 21/561 257/659 |
| 9,461,001 | B1 * | 10/2016 | Tsai ....................... | H01L 23/552 |

(Continued)

*Primary Examiner* — Thienvu Tran
*Assistant Examiner* — Pinping Sun
(74) *Attorney, Agent, or Firm* — Schwabe, Williamson & Wyatt, P.C.

(57) ABSTRACT

Methods, systems, and apparatuses for a foldable fabric-based semiconductor package (FFP) that can assist with charging a secondary cell are described. An FFP includes: a ground plane; a first component over the ground plane; a second component adjacent to the ground plane; a third component adjacent to the second component; a molding compound encapsulating the ground plane, the first component, the second component, and the third component; a first fabric layer on a top side of the molding compound; and a second fabric layer on a bottom side of the molding compound. Each of the first, second, and third components includes one or more semiconductor dies. The third component is electrically coupled to each of the first and second components. The first and second components can wireless charge the secondary cell. The third component can power the first and second components. The ground plane can protect against electromagnetic signals.

17 Claims, 13 Drawing Sheets

(56) References Cited

U.S. PATENT DOCUMENTS

| | | | |
|---|---|---|---|
| 2008/0315389 A1* | 12/2008 | Nunn | H01L 23/3121 |
| | | | 257/690 |
| 2010/0283085 A1* | 11/2010 | Bemanian | H01L 24/14 |
| | | | 257/209 |
| 2015/0171055 A1* | 6/2015 | Yu | H01L 23/3128 |
| | | | 257/777 |
| 2015/0279789 A1* | 10/2015 | Mahajan | H01L 23/552 |
| | | | 257/659 |
| 2016/0233292 A1* | 8/2016 | Chen | H01L 28/10 |
| 2017/0053813 A1* | 2/2017 | Kim | H01L 21/4857 |

* cited by examiner

US 10,014,710 B2

FOLDABLE FABRIC-BASED PACKAGING SOLUTION

FIELD

Embodiments described herein generally relate to semiconductor packages, and specially, to methods, systems, and apparatuses for a foldable fabric-based semiconductor package that can, among others, assist with charging of one or more secondary cells of an electronic device.

BACKGROUND

Many electronic devices (e.g., mobile phones, laptops, tablets, smartwatches, etc.) are powered by secondary cells (e.g., rechargeable batteries, similar energy storage devices, etc.) that need to be charged at regular intervals by power supply devices (also known as chargers, battery chargers, or rechargers).

Generally, the conventional electronic device charging process requires physical connections (such as a wire or a point of contact) between the secondary cell of the electronic device and a stationary or immobile charger. Conventional chargers include, but are not limited to, a direct current (DC) power adapter, a wireless charging plate or bowl apparatus, an alternating current (AC) adapter, an AC/DC adapter, and an AC/DC converter.

In addition, inductive charging (also known as wireless charging) can be used to charge a secondary cell of an electronic device. Generally, wireless charging refers to use of an electromagnetic field to transfer energy between a secondary cell of an electronic device and a charger capable of inductive charging.

Existing wireless charging solutions offer potential advantages (such as greater convenience, durability, and increased protection from corrosion) when compared to more conventional charging solutions that require physical connections. Nevertheless, the shrinking sizes, the increasing mobility, and the increasing performance requirements of electronic devices are creating challenges for semiconductor packages that are part of wireless charging solutions. For example, there is an increased demand for semiconductor packages that assist with on-the-go wireless charging of a secondary cell—i.e., wireless charging that does not require a user to remain at a stationary location while the device is being charged. Further, existing semiconductor packages that are part of wireless charging solutions might charge secondary cells slower, might be more expensive to manufacture, and might be more complex to design than semiconductor packages of more conventional charging solutions.

Some currently existing wireless charging solutions are embodied as one or more objects that are carried around by a user—for example, a wireless charging device encased in a single housing is carried in a user's hand. Carrying such wireless charging solutions around can be inconvenient for a user.

Other currently existing wireless charging solutions require energy used for charging to be harvested from the user of the wireless charging solution. Such energy includes, but is not limited to, vibrational energy, thermal energy, and mechanical energy. There are some disadvantages associated with using energy harvested from a user to wirelessly charge a device—e.g., unpredictable power yield; low power yield; and heavy, rigid, or awkward human energy harvesting devices that can lead to relatively high metabolic energy costs and correspondingly low energy conversion efficiency or impairment of normal physical activity for a user. Further, some wireless charging solutions used in wearables can include semiconductor packages that are suboptimal for size-critical applications.

BRIEF DESCRIPTION OF THE DRAWINGS

Embodiments described herein are illustrated by way of example and not limitation in the figures of the accompanying drawings, in which like references indicate similar features.

DETAILED DESCRIPTION

Figure 1A:
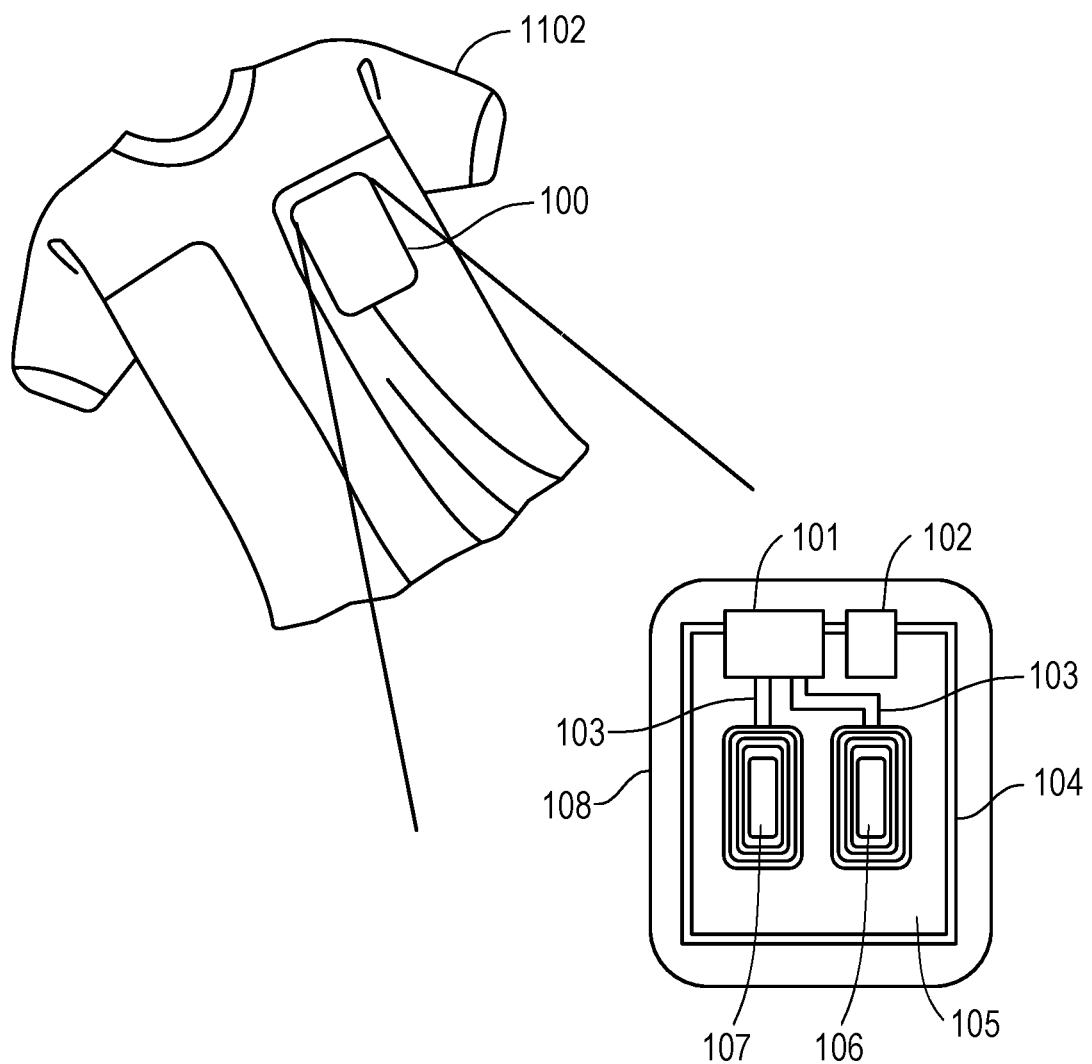
FIG. 1A is a front view of a foldable fabric-based semiconductor package (FFP) that is included in a wearable, in accordance with one embodiment.

Embodiments described herein are directed to methods, systems, and apparatuses for a foldable fabric-based semiconductor package (FFP) that can, among others, assist with on-the-go wireless charging of a secondary cell of an electronic device.

At least one embodiment described herein includes an FFP that can be included as part of a wearable, such that a user wearing the wearable can utilize the FFP to wirelessly charge a secondary cell of an electronic device. In this way, the FFP can assist with providing greater convenience to the user by reducing the wireless charging devices or systems that need to be carried around by the user. For example, the user can wirelessly charge a mobile phone on-the-go using an FFP that is part of a wearable being worn by the user—i.e., wireless charging that does not require the user to remain at a stationary location while the mobile phone is being charged. Moreover, at least one embodiment of the FFP includes a power supply that that does not harvest energy from its user (e.g., a photovoltaic power supply, a thin film lithium ion battery, or other types non-harvesting power supplies). Consequently, for this embodiment, the wireless charging capabilities of the FFP might be more reliable than typical wireless charging solutions, which include devices or systems that harvest energy from a user's body or motions.

For one embodiment, a semiconductor package (e.g., an FFP) includes: an electrically conductive ground plane; a first component over the ground plane; a second component adjacent to the ground plane; a third component adjacent to the second component; a molding compound encapsulating the ground plane, where the molding compound includes one or more molding compound layers (MC layers); the first component, the second component, and the third component; a first fabric layer on a top side of the molding compound; and a second fabric layer on a bottom side of the molding compound. For one embodiment of the semiconductor package (e.g., an FFP), each of the first, second, and thirds components includes one or more semiconductor dies. For one embodiment of the semiconductor package (e.g., an FFP), each of the first and second components is to wirelessly transfer energy to a secondary cell of an electronic device. For one embodiment of the semiconductor package (e.g., an FFP), the third component is to transfer energy to each of the first and second components. For one embodiment, the ground plane is to shield against electromagnetic signals associated with the wireless charging of the secondary cell. For one embodiment of the semiconductor package (e.g., an FFP), the third component is electrically coupled to each of the first and second components. For a further embodiment, the third component is electrically coupled to each of the first and second components via physical connection mechanisms (e.g., an interconnect, a bonding line for wire bonding, a redistribution line that is part of a routing or redistribution layer, etc.).

FIG. 1A is a front view of a foldable fabric-based semiconductor package (FFP) 100 that is included in a wearable 1102, in accordance with one embodiment. As shown in FIG. 1A, the FFP 100 can be part of a pocket of the wearable 1102. The FFP 100, however, is not so limited. The FFP 100 can be included in any type of wearable 1102. As used herein, a "wearable" and its variations refer to any object that (i) includes cloth or fabric and (ii) can be worn on one or more parts of a user. Examples of wearables include, but are not limited to, a piece of clothing, a garment, an apparel, protective wear, footwear, a top, a pair of trousers, a skirt, a dress, a suit, a uniform, outerwear, underwear, lingerie, headwear, nightwear, swimwear, a costume, and an accessory (e.g., a watch, a smartwatch, an electronic watch, an armband, an umbrella, a wallet, a purse, a handkerchief, jewelry, etc.). A wearable also includes a patch or the like worn on a portion of the body or on clothing or any of the items mentioned previously—i.e., anything that can be worn on the body of a user.

For one embodiment, the FFP 100 can be included in the wearable 1102 because the FFP 100 is deformable or foldable. For one embodiment, the FFP 100 is designed to be folded so as to form a receptacle (e.g., a "U" shape, etc.) that an electronic device with one or more secondary cells can be placed into. In this way, the FFP 100 is deformable or foldable so as to enable the FFP 100 to envelope or encase at least some part of the secondary cell(s) or the electronic device having the secondary cell(s). For one embodiment, the FFP 100 can be used to wirelessly charge a secondary cell of an electronic device that is in contact with the FFP 100 or within a proximity of the FFP 100. Inductive charging is known so it will not be discussed in detail herein. For one embodiment, on-the-go wireless charging is initiated when a user wearing the wearable 1102 introduces or inserts a wireless charging enabled electronic device (e.g., a smartphone, a smartwatch, a phablet, a ring, a pair of smart glasses, etc.) into the receptacle formed by folding the FFP 100.

The FFP 100 includes a power supply 101, an optional component 102, interconnects 103, a flexible molding compound 104, a ground plane 105, a first wireless charging coil module 106, a second wireless charging coil module 107, and a fabric layer 108. For one embodiment, the power supply 101 is to provide energy or power to other components of the FFP 100 to enable these components to function properly. The power supply 101 can be a photovoltaic power supply (that includes one or more solar cells), a battery (e.g., a thin film battery, a lithium-ion battery, a 3D thin film lithium-ion battery, or a 3D printed lithium-ion microbattery, a printed battery, an ultra-thin lithium battery, a thin-film lithium polymer battery, a stretchable lithium-ion battery, a bendable lithium-based battery, a, flexible nanotube ink battery, etc.), or any other type of known power supply that does not primarily rely on harvesting energy from a user's motions or body. The direct current (DC) power from the power supply 101 may be converted to alternating current (AC) power through a component such as an oscillator (not shown) or a DC-AC inverter (not shown) to induce a voltage in receiver coil(s) of the secondary cell(s). The interconnects 103 (which include one or more conductive metal routing lines or layers) can be used to electrically couple the power supply 101 to each of the other components of the FFP 100.

The FFP 100 can also include an optional component 102, which can be coupled via the interconnects 103 to the power supply 101 and the modules 106-107. This optional component 102 can include at least one of a display output device (e.g., a display panel, etc.), an audio output device (e.g., a speaker, etc.), or a haptic output device (e.g., a tactile haptic feedback device, etc.). For one embodiment, the optional component 102 can be used to communicate information to a user wearing the wearable 1102 regarding one or more components or functions of the FFP 100. For a first example, the component 102 can be used to provide information about a secondary cell being wirelessly charged by the FFP 100. For a second example, the component 102 can be used to provide information about the power supply 101 and its capability to supply the components of the FFP 100 with sufficient power.

The FFP 100 also includes a flexible molding compound 104. The flexible molding compound 104 can be formed from one or more molding compound layers (also referred to herein as MC layers). For one embodiment, each of the one or more MC layers is formed from a dielectric material (e.g., a polyimide-based dielectric material, etc.). In this way, the flexible molding compound 104 can be formed from a dielectric material. For one embodiment, the dielectric material is selected from at least one of polyester (e.g., Mylar, etc.), polyimide (e.g., Kapton, etc.), aramid, fiberglass-epoxy composites, fiberglass-epoxy-silicone composites, poly siloxanes, epoxy resins, acrylates, Methyl methacrylate (e.g., poly methyl methacrylate, etc.), polyurethanes, benzocyclobutene (BCB), polyimide, polyamide, high-density polyethylene (HDPE), bismaleimide-triazine (BT) resins, liquid crystal polymer (LCP), or polydimethylsiloxane (PDMS).

For one embodiment, the molding compound 104 encapsulates at least one of the ground plane 105, the charging modules 106-107, the power supply 101, or the optional component 102. In this way, at least one of the ground plane 105, the charging modules 106-107, the power supply 101, or the optional component 102 is embedded in the flexible molding compound 104.

For one embodiment, the flexible molding compound 104 is a flexible insulator, such as a film or a laminate formed from a plastic film (e.g., a polyimide film, etc.). For this embodiment, the interconnects 103 can be formed by laminating the flexible molding compound 104 with a thin film of rolled copper, then forming a pattern of photoresist on the copper, and etching away the unwanted copper in accordance with known methods.

The FFP 100 also includes a ground plane 105. The ground plane 105 can have multiple layers. For one embodiment, the ground plane 105 is included in the FFP 100 to perform at least one of the following: control, inhibit, or eliminate an amount of radiation that travels to a user of the wearable 1102 when the FFP 100 is in operation; or control a direction of travel of the radiation associated with wireless charging (e.g., direct the radiation away from a user of the wearable 1102, etc.). For one embodiment, the ground plane 105 includes at least one of a ground reference plane or a shielding plane. The ground reference plane is to act as a ground reference to provide greater isolation between signals associated with the operations of at least one of the power supply 101, the charging modules 106-107, or the optional component 102. In this way, the ground reference plane can assist with noise shielding and reducing cross talk between signals associated with the operations of at least one of the power supply 101, the charging modules 106-107, or the optional component 102. The shielding plane is provided to act as a shielding structure to assist in sequestering local electromagnetic (EM) noise to areas that remain near the source of the noise. Thus, the shielding plane can act to limit how far EM signals associated with the operations of at least one of the power supply 101, the charging modules 106-107, or the optional component 102 can travel. For one embodiment, the ground plane 105 is embedded in the flexible molding compound 104.

Furthermore, the FFP 100 includes a first wireless charging coil module 106 and a second wireless charging coil module 107. For one embodiment, each of the charging modules 106-107 work together to wirelessly transfer energy to secondary cell of an electronic device in order to inductively charge the secondary cell. While the specific embodiment of the FFP 100 illustrated in FIG. 1A includes two charging modules 106-107, it is to be appreciated that other embodiments of the FFP 100 can include less or more than two charging modules—e.g., a single charging module, three charging modules, etc.

For the specific embodiment of the FFP 100 illustrated in FIG. 1A, each of the charging modules 106-107 includes at least one of the following: at least one coil assembly that includes coil(s), magnet(s), and any other known component required for inductive charging; and one or more semiconductor dies (which are integrated circuits, microprocessors, or other types of processors) designed to perform several functions related to inductive charging. For example, functional circuits can be fabricated on the die(s) of the charging modules 106-107 for at least one of the following: communication with an electronic device or the device's secondary cell via technologies for exchanging data (e.g., Bluetooth, radio frequency communication, cellular radio communication, near field communication, etc.); regulation and management of electrical energy being delivered to an electronic device's secondary cell; or measurement of parameters of an electronic device or the device's secondary cell being charged (e.g., a current, a voltage, a temperature, etc.).

The FFP 100 also includes a fabric layer 108. For one embodiment, the fabric layer 108 includes at least two parts—e.g., a first fabric layer on a top side of the FFP 100, a second fabric layer on a bottom side of the FFP 100, any other fabric layer on any other side of the FFP 100 as is needed, etc. For one embodiment, the fabric layer 108 is laminated onto the flexible molding compound 104 (which encapsulates at least one of the power supply 101, the optional component 102, the interconnects 103, the ground plane 105, or the charging modules 106-107). For one embodiment, an inner fabric layer 108 is laminated onto a top side of the flexible molding compound 104 and an outer fabric layer 108 is laminated onto a bottom side of the flexible molding compound 104. For one embodiment, adhesive layer(s) may be introduced to further couple the fabric layer 108 to the FFP 100 in order to provide improved adhesion strength and water resistant for the FFP 100. For example, adhesive layers couple the inner fabric layer 108 and the outer fabric layer 108 to the top and bottom sides of the flexible molding compound 104, respectively. The fabric layer 108 is formed from at least one of naturally occurring fibers (e.g., animal fiber, plant fibers, combinations thereof, etc.) or man-made fibers (e.g., regenerated fibers, synthetic fibers, combinations thereof, etc.). Examples of fibers include, but are not limited to, cotton fibers, microfibers, polyester-based fibers, and any combinations thereof.

Figure 1B:
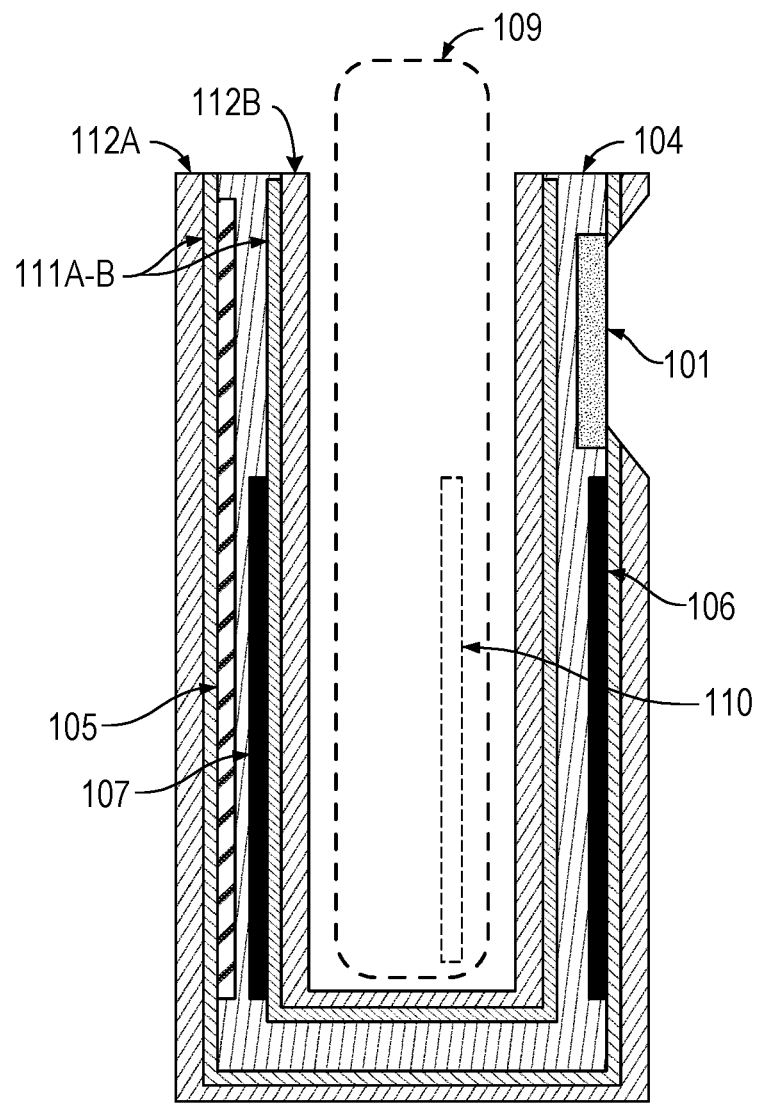
FIG. 1B is a cross-sectional view of the FFP illustrated in FIG. 1A, in accordance with one embodiment.

FIG. 1B is a cross-sectional view of the FFP 100 illustrated in FIG. 1A, in accordance with one embodiment. For the sake of brevity, only the differences between FIGS. 1A and 1B will be described below in connection with FIG. 1B One difference between FIGS. 1A and 1B is the presence of an electronic device 109 that includes a secondary cell 110. As explained above in connection with FIG. 1A, the receptacle (e.g., a "U" shape, etc.) formed by folding the FFP 100 enables on-the-go wireless charging, which is initiated when a user wearing the wearable 1102 introduces or inserts a wireless charging enabled electronic device (e.g., a smartphone, a smartwatch, a phablet, a ring, a pair of smart glasses, etc.) into the receptacle.

The electronic device 109 can include a receiver (not shown) designed to receive the energy transferred from the charging modules 106-107 to the secondary cell 110. The receiver can include one or more coils or wires to receive the energy transferred by the FFP 100. Alternatively or additionally, the receiver can be included in the secondary cell 110. In any of these configurations, the receiver includes one or more appropriate coil or wire geometries that can receive power from the FFP 100 when the receiver is placed near to the FFP 100. The receiver (not shown), which may be part of the electronic 109 or the secondary cell 110, can also be used to rectify and/or smooth the energy being transferred from each of the charging modules 106-107 to the electronic device 109 or its secondary cell 110 before the energy is provided to the secondary cell 110. In addition, the device 109 and/or the cell 110 can include logic or circuitry (composed of hardware, software, or a combination of both) for sensing parameters of the device 109 and/or the cell 110; and for managing or converting the energy being transferred to the secondary cell to a usable form. The device 109 can include memory for storing the information related to the inductive charging (e.g., the sensed information, etc.). Furthermore, the device 109 can include an appropriate protocol stored in the memory that is used by the logic and/or circuitry of the device 109 or the logic and/or circuitry of the cell 110 itself to generate an appropriate charging profile for the secondary cell 110.

Figure 2A:
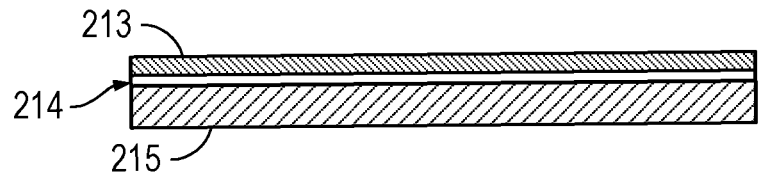
FIGS. 2A-2L illustrate cross-sectional side view illustrations of a method of forming an FFP, in accordance with one embodiment.

FIGS. 2A-2L illustrate cross-sectional side view illustrations of a method of forming an FFP, in accordance with one embodiment. Referring to FIG. 2A, the process of forming the FFP can begin with a carrier substrate 215, e.g., a silicon wafer, a glass wafer, a metal carrier, etc. For embodiment, the carrier substrate 215 is a metal substrate—e.g., a copper substrate, etc. As shown in FIG. 2A, an adhesive layer 214 is applied on the substrate 215. For example, the layer 214 is a temporary adhesive, e.g., a polyimide adhesive, a polymeric bonding agent, adhesive tapes, etc. Furthermore, and as shown in FIG. 2A, a resist layer 213 (e.g., a dry film resist layer, a spin-on resist layer, etc.) is applied on the layer 214. For some embodiments, at least one of a dielectric layer, a seed layer, a metal layer, or another layer (e.g., a protection layer, a passivation layer, etc.) is applied on the layer 214 before the resist layer 213. The dielectric layer can act as a stress buffer that assists with reducing or eliminating stress-induced damage when components are applied to the substrate 215 to the contact pads of the semiconductor die. The dielectric layer can be deposited before the seed layer is deposited, such that the seed layer is applied on a top surface of the dielectric layer. The dielectric layer may be structured before the seed layer is applied on the dielectric layer.

The seed layer may be made of a suitable metal or metal alloy. The seed layer may be deposited by using, for example, sputtering, electroless deposition, evaporation or any other appropriate technique. For one embodiment, the seed layer may consist of an adhesion promoter/diffusion barrier layer and a layer providing electrical conductivity. For example, the seed layer may be composed of two thin metal layers stacked on each other, where a bottom one of the two layers is the adhesion promoter/diffusion barrier layer and a top one of the two layers is the layer providing electrical conductivity.

Referring again to FIG. 2A, the resist layer 213 that is applied to the substrate 215 can be a spin-on resist layer, a dry film resist layer, or any other suitable resist layer. The resist layer 213 can be applied by spin-coating or any other suitable technology. For one embodiment, the resist layer 213 is one or more thin layers used to transfer a circuit pattern to the semiconductor substrate on which the resist layer 213 is deposited. The resist layer 213 can be patterned via lithography to form a (sub)micrometer-scale, temporary mask that protects selected areas of the underlying substrate during subsequent processing steps. The material used to prepare said thin layer is typically a viscous solution. The resist layer 213 can be formed from at least one of a polymeric material, an epoxy material, mixtures of polymers, or other small molecules (e.g. photoacid generators) that have been specially formulated for a given lithography technology. For one embodiment, the resist layer 213 is a photoresist layer, which is a specific type of resist layer used during photolithography. For a further embodiment, the photoresist layer 213 can be a positive photoresist layer or a negative photoresist layer.

Figure 2B:
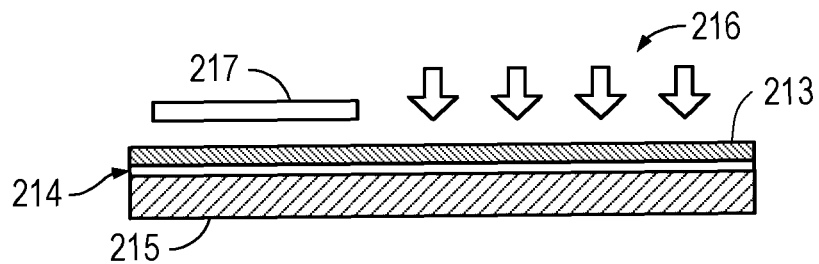

Referring now to FIG. 2B, known exposure operations are used to expose the resist layer 213. In the specific embodiment shown in FIG. 2B, the exposure operation includes use of a mask 217 (e.g., a glass mask, etc.) and ultraviolet (UV) light 216. Nevertheless, exposing the resist layer 213A can be performed using several techniques—e.g., lithography via at least one of a photolithography stepper or a mask aligner, digital imaging lithography tool via a laser direct imaging tool, maskless lithography via a maskless lithography tool, etc. As shown in FIG. 2B, and for one embodiment, the mask 217 is used to prevent against exposure of a portion of the resist layer 213. For one embodiment, the unexposed portion shielded from the UV light 216 by the mask 217 is etched away to create an opening in the resist layer 213. The etching can be performed using techniques—e.g., chemical etching techniques, etc.

Figure 2C:
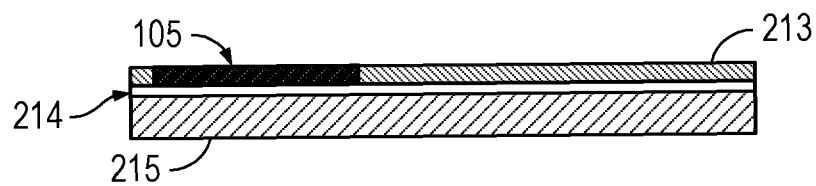

Referring now to FIG. 2C, a ground plane 105 is formed in the opening in the resist layer 213. For one embodiment, and as explained above in connection with FIG. 1A, the ground plane 105 includes at least one of a ground reference plane or a shielding plane. The ground plane 105 can be formed using an electroplating process. The ground plane 105 can be formed from a suitable metal, metal alloys, or metal foams—e.g., aluminum, brass, copper, steel, tin, nickel, titanium, combinations thereof, etc. After the ground plane 105 is formed, the exposed portions of the resist layer 213 are removed via one or more removal techniques—e.g., liquid resist strippers, chemical solvent removal techniques, plasma oxidization (also known as plasma etching), etc.

Figure 2D:
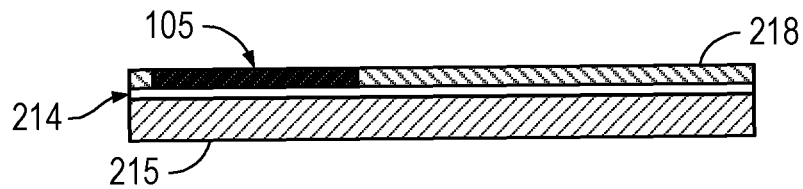

Referring now to FIG. 2D, the ground plane 105 and the area on the substrate 215 where the exposed portions of the resist layer 213 used to be are encapsulated in a first layer of a molding compound 218 (first MC layer 218) on the layer 214. For example, and for one embodiment, the ground plane 105 and the substrate 215 (i.e., the area where the exposed portions of the resist layer 213 used to be prior to their removal from the substrate 215) are encapsulated in the first MC layer 218. The molding compound used to form the first MC layer 218 can comprise any suitable molding compound—e.g., a ceramic, plastic, epoxy, a combination thereof, etc. As used herein, "encapsulating" does not require all surfaces to be encased within a molding compound or an MC layer. For example, and as illustrated in FIG. 2D, the lateral sides of the ground plane 105 are encased in the first MC layer 218, while the first MC layer 218 is not formed over the top side of the ground plane 105. As will become apparent in the following description, for some embodiments, additional MC layers (not shown in FIG. 2C) are at least one of: (i) used to encapsulate the first MC layer 218; or (ii) stacked on a top side of the first MC layer 218. Furthermore, additional encapsulation operations (e.g., polishing, etc.) may be subsequently performed in order to achieve the desired thickness and/or surface flatness of the ground plane 105. Accordingly, for some embodiments, the amount of molding compound or MC layer is controlled to achieve a specified height. Alternatively or additionally, an amount of the molding compound or MC layer can be removed after application in order to expose the top surfaces of the components of the FFP being formed. The first MC layer 218 can, for example, be polished via known polishing techniques to achieve a specified height for the first MC layer 218 and/or to reveal a top side of the ground plane 105. Nevertheless, and for at least one embodiment, it is not required that that the top surfaces of the components of the FFP being formed are exposed, and the molding compound or MC layer may cover the top surfaces of the components of the FFP being formed.

For one embodiment, the first MC layer 218 is a film or a laminate formed from dielectric materials that is laminated onto the layer 214. For this embodiment, the first MC layer 218 includes an opening for the ground plane 105.

Figure 2E:
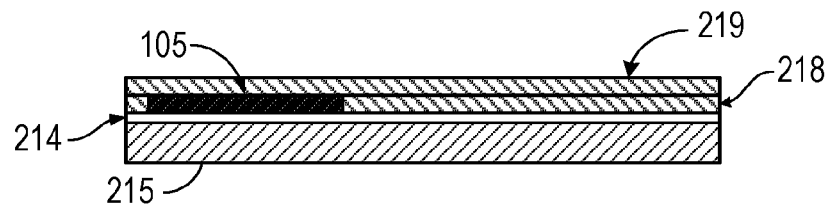

Referring now to FIG. 2E, the first MC layer 218 is encapsulated in a second layer of a molding compound 219 (second MC layer 219) on the layer 214. The molding compound used to form the second MC layer 219 can comprise any suitable molding compound—e.g., a ceramic, plastic, epoxy, a combination thereof, etc. For example, and as illustrated in FIG. 2E, the top side of the first MC layer 218 is encased in the second MC layer 219, while the second MC layer 219 is not formed on, over, or around the lateral sides of the first MC layer 218. For one embodiment, the second MC layer 219 is a film or a laminate formed from dielectric materials that is laminated onto the first MC layer 218. For this embodiment, the second MC layer 219 covers a top surface of the first MC layer 218.

Figure 2F:
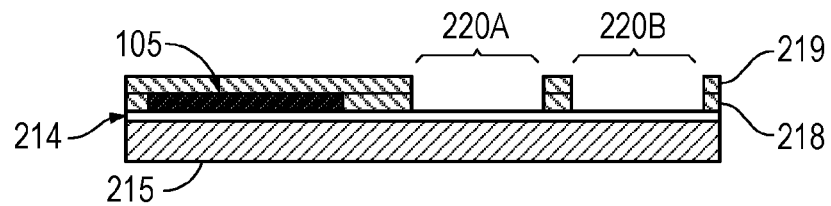

Referring now to FIG. 2F, first and second cavities 220A-B are formed in locations that are laterally adjacent to the ground plane 105. As shown in FIG. 2F, the first cavity 220A is between the ground plane 105 and the second cavity 220B. Each of the first cavity 220A and the second cavity 220B extends through the first and second MC layers 218-219 until the layer 214. The first and second cavities 220A-B can be formed using an etching process—e.g., a chemical etching technique, a laser etching technique, etc. For one embodiment, the x-y dimensions of each of the first cavity 220A and the second cavity 220B is predetermined to accept a first component 106 and a third component 101, as is apparent from FIG. 2G below (which is described below).

Figure 2G:
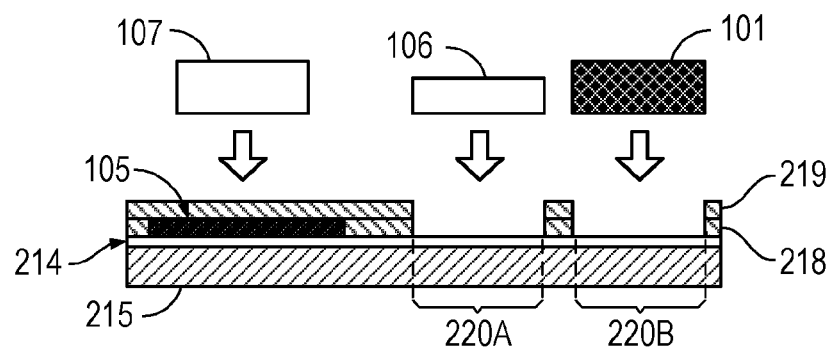

Referring now to FIG. 2G, a first component 106, a second component 107, and a third component 101 are transferred onto the layer 214 or the second MC layer 219 using a suitable technique such as a pick and place machine. For one embodiment, each of the first component 106, the second component 107, and the third component 101 includes one or more semiconductor dies. For a further embodiment, the semiconductor die(s) have exposed contact pads. For one embodiment, the first component 106 is similar to or the same as the charging module 106 described above in connection with FIGS. 1A-1B. For one embodiment, the second component 107 is similar to or the same as the charging module 107 described above in connection with FIGS. 1A-1B. For one embodiment, the third component 101 is similar to or the same as the power supply 101 described above in connection with FIGS. 1A-1B.

For one embodiment, and as shown in FIG. 2G, the first component 106 is transferred into the first cavity 220A, such that the first component 106 is directly on and attached to the layer 214. For one embodiment, and as shown in FIG. 2G, the second component 107 is transferred onto and directly attached to the second MC layer 219, such that the second component 107 is over the ground plane 105. For one embodiment, and as shown in FIG. 2G, the third component 101 is transferred into the second cavity 220B, such that the third component 101 is directly on and attached to the layer 214.

Figure 2H:
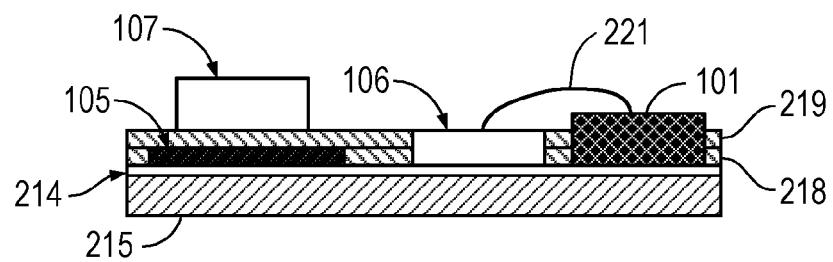

Referring now to FIG. 2H, the third component 101 is electrically coupled to each of the first component 106 and the second component 107. For embodiment, third component 101 is electrically coupled to each of the first component 106 and the second component 107 via physical connection mechanisms. For example, the wire bond(s) 221 can be used to couple the third component 101 to at least one of the first component 106 or the second component 107. In addition, interconnects (such as conductive metal traces or routing lines), which are not shown in FIG. 2H, can be used to physically couple the third component 101 to at least one of the first component 106 or the second component 107. In the specific embodiment illustrated in FIG. 2H, only one wire bond 221 couples the third component 101 to the first component 106. It is to be appreciated that other wire bonds (not shown) can be used to couple the third component 101 to at least of the first component 106 or the second component 107.

Figure 2I:
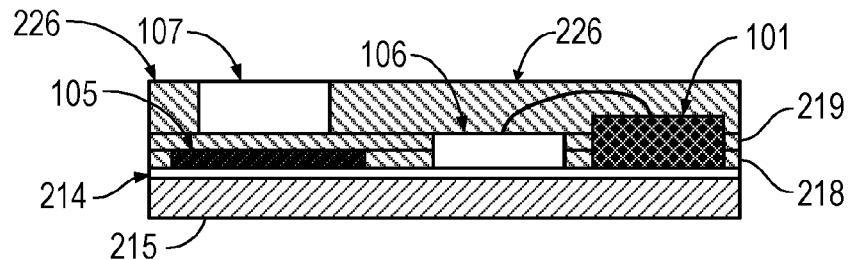

Referring now to FIG. 2I, the first MC layer 218, the second MC layer 219, the first component 106, the second component 107, the third component 101, the wire bond(s) 221, and the interconnects (not shown) are encapsulated in a third layer of a molding compound 226 (third MC layer 226) on the layer 214. The molding compound used to form the third MC layer 226 can comprise any suitable molding compound—e.g., a ceramic, plastic, epoxy, a combination thereof, etc. For example, and as illustrated in FIG. 2I, the third MC layer 226 encapsulates the lateral sides of the second component 107, the top side of the second MC layer 219, the top side of the first component 106, the top and portions of the lateral sides of the third component 101, the wire bonds 211, and the interconnects (not shown); however, the third MC layer 226 is not formed on, over, or around the lateral sides of the first MC layer 218, the lateral sides of the second MC layer 219, and the top side of the second component 107. For one embodiment, the third MC layer 226 is a film or a laminate formed from dielectric materials that is laminated onto the second MC layer 219. For this embodiment, the third MC layer 226 is designed to include an opening for a top surface of the second component 107.

Figure 2J:
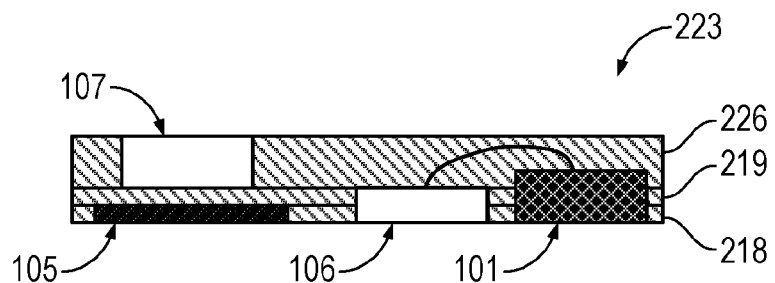

Referring now to FIG. 2J, the temporary adhesive layer 214 and carrier substrate 215 may then be removed after application of third MC layer 226 resulting in a flexible wireless charging package 223 with an embedded ground plane 105, an embedded component 101, an embedded component 106, and an embedded component 107 that each has exposed sides. The adhesive layer 214 and carrier substrate 215 may be removed via known removal techniques—e.g., a chemical etching process, etc.

Figure 2K:
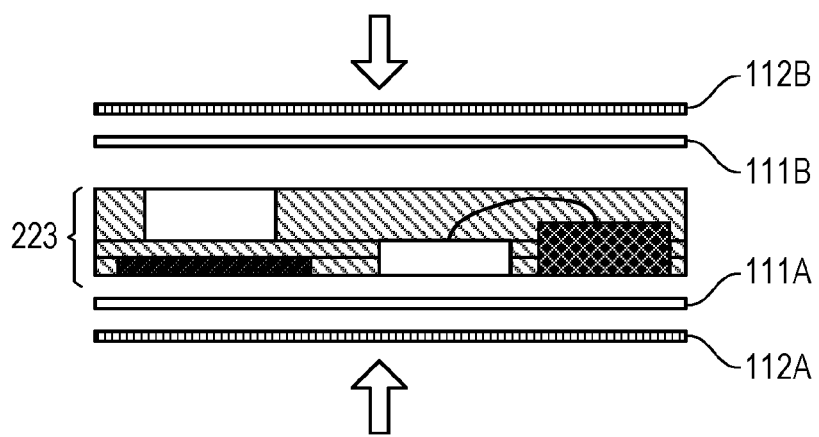
Figure 2L:
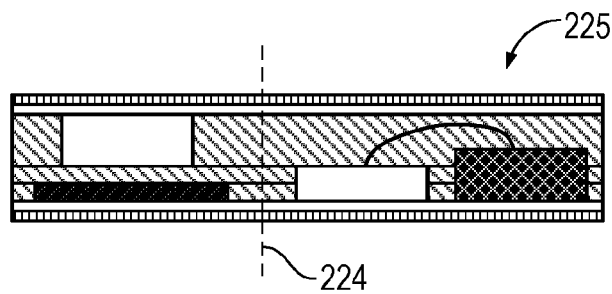

Referring now to FIGS. 2K-2L, an outer fabric layer 112A and an inner fabric layer 112B are transferred onto and attached to bottom and top sides of the flexible wireless charging package 223, respectively, to form an FFP 225. Each of the fabric layers 112A-B is formed from a fabric material. For one embodiment, a fabric material is formed from at least one of naturally occurring fibers (e.g., animal fiber, plant fibers, combinations thereof, etc.) or man-made fibers (e.g., regenerated fibers, synthetic fibers, combinations thereof, etc.). Examples of fibers include, but are not limited to, cotton fibers, microfibers, polyester-based fibers, and any combinations thereof. In the specific embodiment illustrated in the FIG. 2K, adhesive layers 111A-B are used to attach the fabric layers 112A-B, respectively, to the flexible wireless charging package 223. It is to be appreciated that the adhesive layers 111A-B are merely optional and are not always required in every embodiment. Adhesive layers 111A-B can be adhesives designed to provide improved adhesion strength between the outer fabric layer 112A and inner fabric layer 112B and the flexible wireless charging package 223. Moreover, the adhesive layers 111A-B can be adhesives designed to provide water resistance for the flexible wireless charging package 223. The adhesive layers 111A-B can be formed from at least one of the following: an epoxy-based resin (e.g., a solid-phase epoxy resin, a liquid-phase epoxy resin, bisphenol A, bisphenol F, a phenoxy resin, a cresol novolac resin, etc.); an organic filler (e.g., polyimide, polyamideimide, polyesterimide, nylon, silicon resin, etc.); a curing agent (e.g., amines, anhydrides, amides, latent curing agents, curing agents with high melting points, etc.); or an inorganic filler (e.g., silica, aluminum nitride, or alumina, etc.). The adhesive layers 111A-B can also include at least one modifier, which can be formed from of at least one of an amino-based compound, a silane-based compound, an acrylic compound, metal organic salt, silicon oxide, or titanium oxide.

Referring specifically to FIG. 2L, the folding point 224 is determined in the FFP 225 to determine an area for folding or deforming the FFP 225 for wirelessly charging a secondary cell of an electronic device. For one embodiment, the folding point 224 is determined via inspection. An inspection tool can be used to determine the folding point 224. For example, the inspection tool is a scanner. As shown in FIG. 2L, it may be necessary to provide a large enough area in the x-y dimensions between the ground plane 105 and the first component 106, such that the folding point 224 is large enough to be adapted to electronic devices of different sizes.

FIGS. 3A-3E illustrate cross-sectional side view illustrations of a method of forming an FFP, in accordance with another embodiment. FIGS. 3A-3E includes some components that have already been described above in connection with FIGS. 2A-2L. For the sake of brevity, only the differences between FIGS. 3A-3E and FIGS. 2A-2L are described below in connection with FIGS. 3A-3E.

Figure 3A:
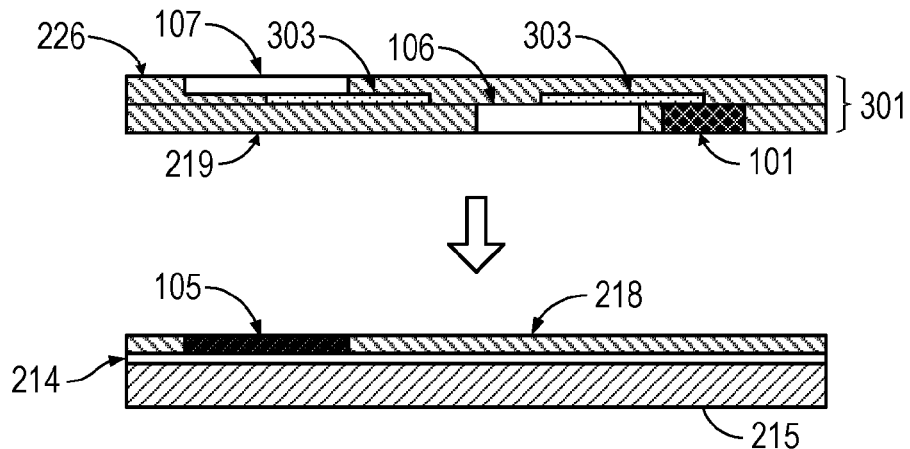
FIGS. 3A-3E illustrate cross-sectional side view illustrations of a method of forming an FFP, in accordance with another embodiment.

Referring now to FIG. 3A, a thin film package 301 includes at least one of the following: the second MC layer 219; the third MC layer 226; the component 106; the component 107; the power supply 101 (e.g., a thin film battery, a lithium-ion battery, a 3D thin film lithium-ion battery, or a 3D printed lithium-ion micro-battery, a printed battery, an ultra-thin lithium battery, a thin-film lithium polymer battery, a stretchable lithium-ion battery, a bendable lithium-based battery, a, flexible nanotube ink battery, etc.); and conductive traces 303 formed in between the second MC layer 219 and the third MC layer 226 to electrically couple the power supply 101 to the components 106 and 107. The conductive traces 303 can be formed using any suitable process—e.g., an electroplating process, etc.

As shown in FIG. 3A, the component 101 and the component 106 are embedded in the second MC layer 219 to form a first portion of the thin film package 301, while the component 107 is embedded in the third MC layer 226 to form a second portion of the thin film package 301. Thus, the first and second portions of the thin film package 301 can be laminated together to form the thin film package 301. As is apparent from the above description, each of the first and second portions of the thin film package 301 can be manufactured as a single discrete component that is subsequently used to form the complete thin film package 301. Furthermore, the thin film package 301 can be viewed as a single discrete component that is subsequently used to form an FFP.

Moreover, the ground plane 105 and the first MC layer 218 that encapsulates the ground plane 105 are prepared for attachment with the thin film package 301. The ground plane 105 and the first MC layer 218 that encapsulates the ground plane 105 are described above in connection with FIGS. 2A-2D.

Figure 3B:
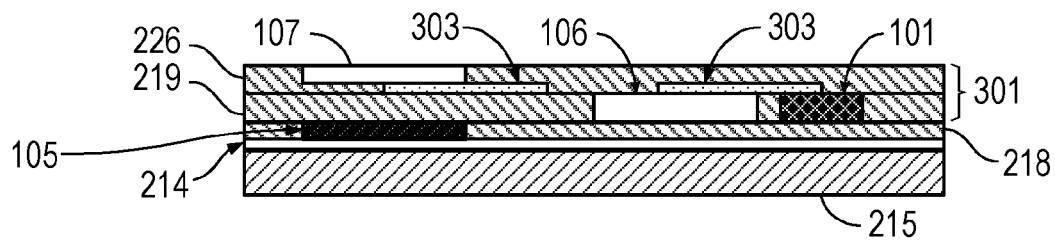

Referring now to FIG. 3B, the thin film package 301 is transferred onto the first MC layer 218 that encapsulates the ground plane 105 via a suitable technique—e.g., a pick and place machine. Furthermore, the thin film package 301 is attached or laminated to the first MC layer 218 that encapsulates the ground plane 105.

Figure 3C:
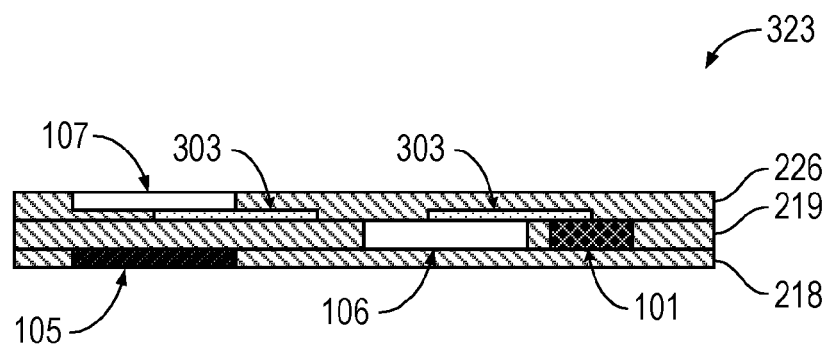

Referring now to FIG. 3C, the temporary adhesive layer 214 and carrier substrate 215 may then be removed after application of third MC layer 226 resulting in a flexible wireless charging package 323 with an embedded ground plane 105, an embedded component 101, an embedded component 106, and an embedded component 107. The adhesive layer 214 and carrier substrate 215 may be removed via known removal techniques—e.g., a chemical etching process.

Figure 3D:
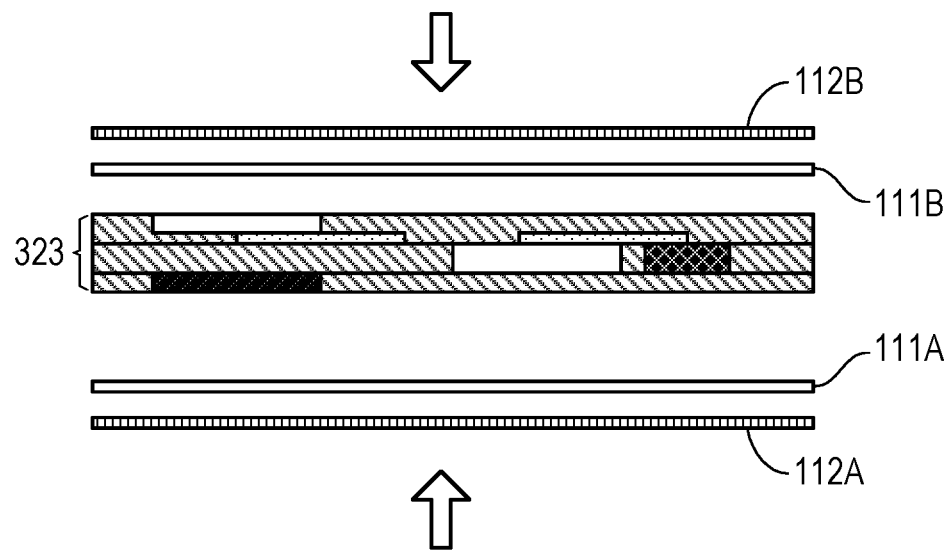
Figure 3E:
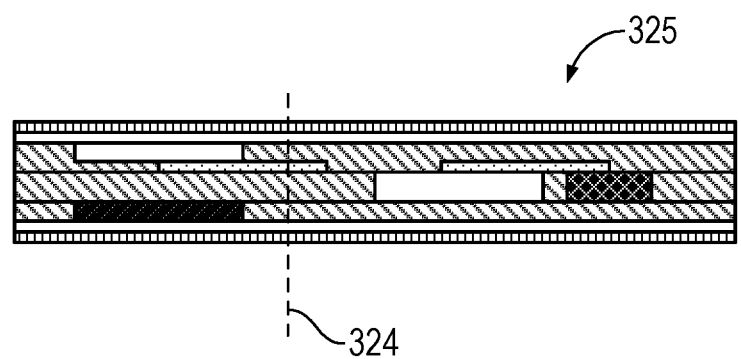

Referring now to FIGS. 3D-3E, an outer fabric layer 112A and an inner fabric layer 112B are transferred onto and attached to bottom and top sides of the flexible wireless charging package 323, respectively, to form an FFP 325. In the specific embodiment illustrated in the FIG. 3D, adhesive layers 111A-B are used to attach the fabric layers 112A-B, respectively, to the flexible wireless charging package 323. Adhesive layers 111A-B are described above in connection with FIGS. 2J-2L.

Referring specifically to FIG. 3E, the folding point 324 is determined in the FFP 325 to determine an area for folding or deforming the FFP 325 for wirelessly charging a secondary cell of an electronic device. For one embodiment, the folding point 324 is determined via inspection. An inspection tool can be used to determine the folding point 324. For example, the inspection tool is a scanner. As shown in FIG. 3E, it may be necessary to provide a large enough area in the x-y dimensions between the ground plane 105 and the first component 106, such that the folding point 324 is large enough to be adapted to electronic devices of different sizes.

Figure 4A:
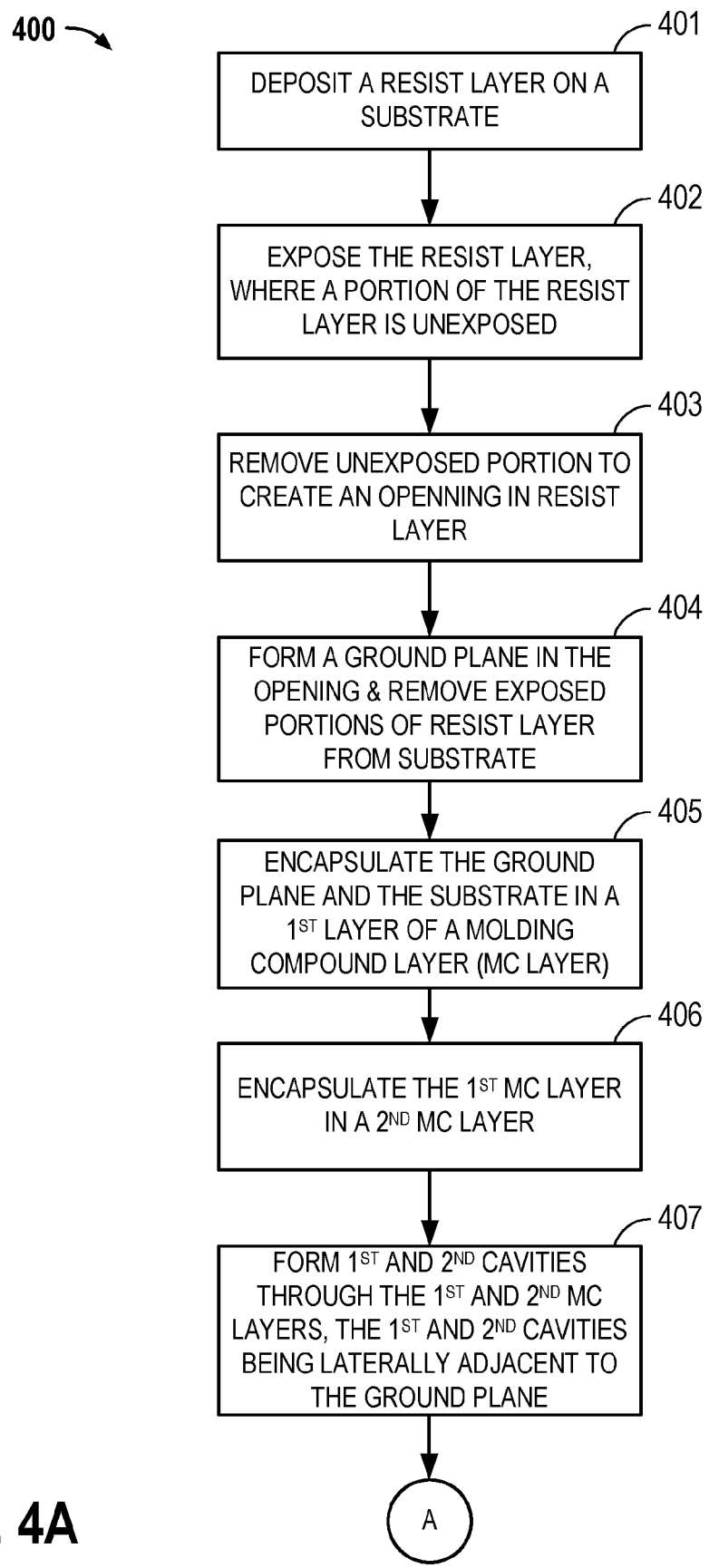
FIGS. 4A-4C are process flow illustrations of a method of forming an FFP, in accordance with one embodiment.
Figure 4B:
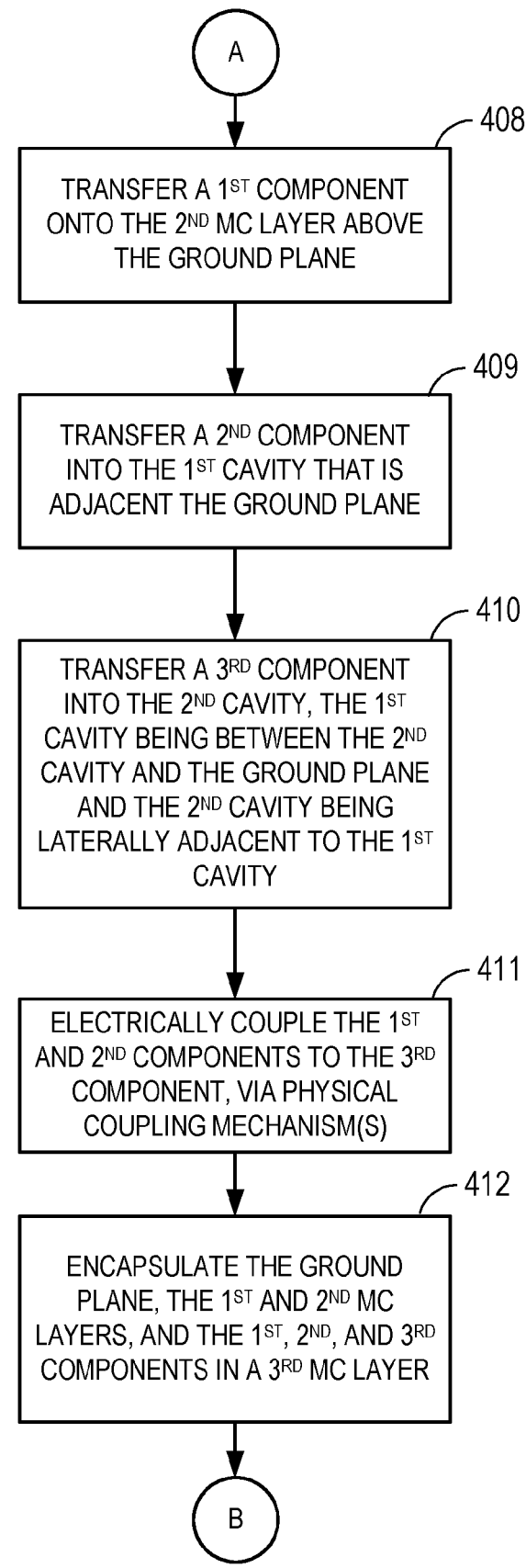
Figure 4C:
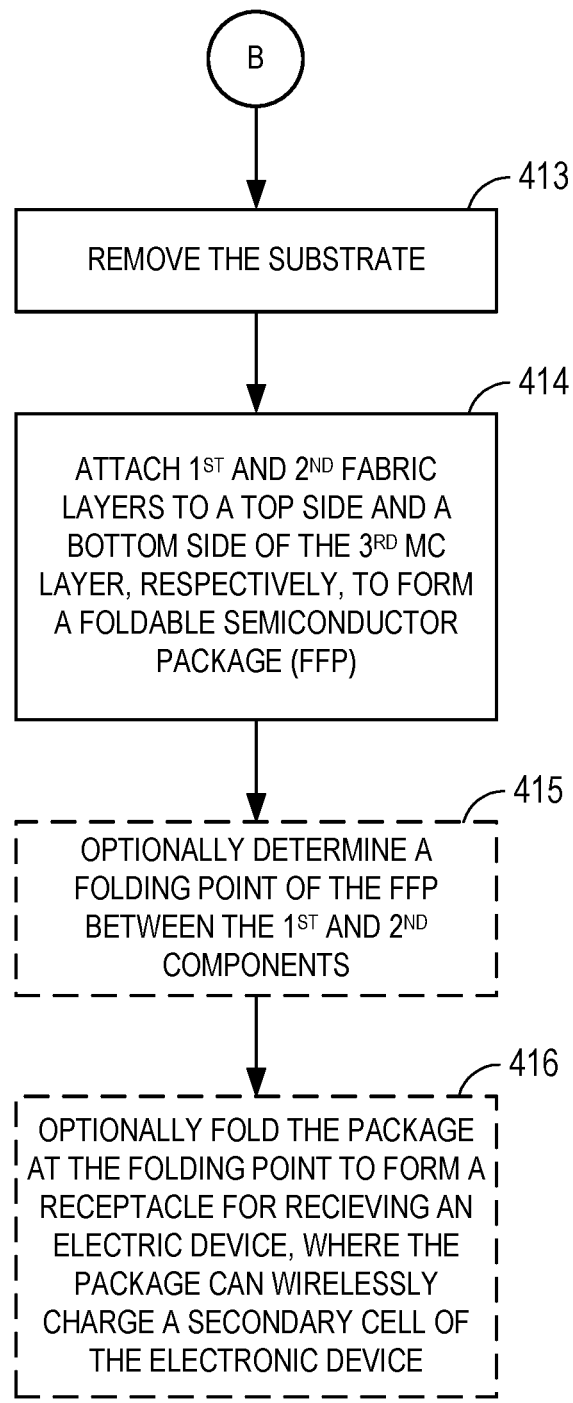

FIGS. 4A-4C are process flow illustrations of a method 400 of forming an FFP, in accordance with one embodiment. Process 400 begins at block 401, where a resist layer is applied on the substrate that may include a temporary adhesive layer. Block 401 can be performed as described above in connection with FIG. 2A. At block 402, one or more exposure operations are used to expose the resist layer, where a portion of the resist layer is unexposed. Block 402 can be performed as described above in connection with FIG. 2B. At block 403, the unexposed portion of the resist layer is removed to form an opening in the resist layer. Block 403 can be performed as described above in connection with FIG. 2B.

Process 400 proceeds to block 404, where a ground plane is formed in the opening in the resist layer. In addition, and at block 404, the exposed portions of the resist layer are removed after the ground plane is formed. Block 404 can be performed as described above in connection with FIG. 2C. At block 405, the ground plane and the substrate are encapsulated in a first layer of a molding compound (first MC layer). For example, and for one embodiment, the ground plane and the substrate (i.e., the area on the substrate where the exposed portions used to be) are encapsulated in the first MC layer. Block 405 can be performed as described above in connection with FIG. 2D. At block 406, the first MC layer is encapsulated in a second layer of a molding compound (second MC layer). Block 406 can be performed as described above in connection with FIG. 2E. At block 407, first and second cavities are formed in locations that are laterally adjacent to the ground plane through the first and second MC layers. Block 407 can be performed as described above in connection with FIG. 2F.

At blocks 408-410, a first component, a second component, and a third component are transferred onto the substrate or the second MC layer. Blocks 408-410 can be performed as described above in connection with FIG. 2G. For one embodiment, the first component is transferred onto and directly attached to the second MC layer, such that the first component is over the ground plane. For one embodiment, the second component is transferred into the first cavity, such that the second component is directly on and attached to the substrate (or the temporary layer on the substrate). For one embodiment, the third component is transferred into the second cavity, such that the third component is directly on and attached to the substrate (or the temporary layer on the substrate). Each of the first, second, and third components include one or more semiconductor die. The first and second components can be the charging modules described above in connection with FIGS. 1A-1B and 2A-2L. The third component can be the power supply 101 described above in connection with FIGS. 1A-1B and 2A-2L.

Process 400 proceeds to block 411, where the third component is electrically coupled to each of the first component and the second component. Block 411 can be performed as described above in connection with FIG. 2H. At block 412, the first MC layer, the second MC layer, the first component, the second component, the third component, the wire bond(s), and the interconnect(s) are encapsulated in a third layer of a molding compound (third MC layer) on the substrate (or the temporary layer on the substrate). Block 412 can be performed as described above in connection with FIG. 2I. Block 413 includes removing the substrate (and/or the temporary layer on the substrate) after application of third MC layer resulting in a flexible wireless charging package. Block 413 can be performed as described above in connection with FIG. 2J. At block 414, an outer fabric layer and an inner fabric layer are transferred onto and attached to bottom and top sides of the flexible wireless charging package, respectively, to form an FFP. Block 414 can be performed as described above in connection with FIGS. 2K-2L.

Process 400 also includes optional blocks 415 and 416. At blocks 415-416, a folding point of the FFP is determined to locate an area for folding or deforming the FFP, which can enable a secondary cell of an electronic device to be wirelessly charged when the electronic device is placed in a receptacle formed by folding the FFP into a "U" shape. Blocks 415-416 can be performed as described above in connection with FIGS. 1A-B and FIGS. 2L-2K.

Figure 5A:
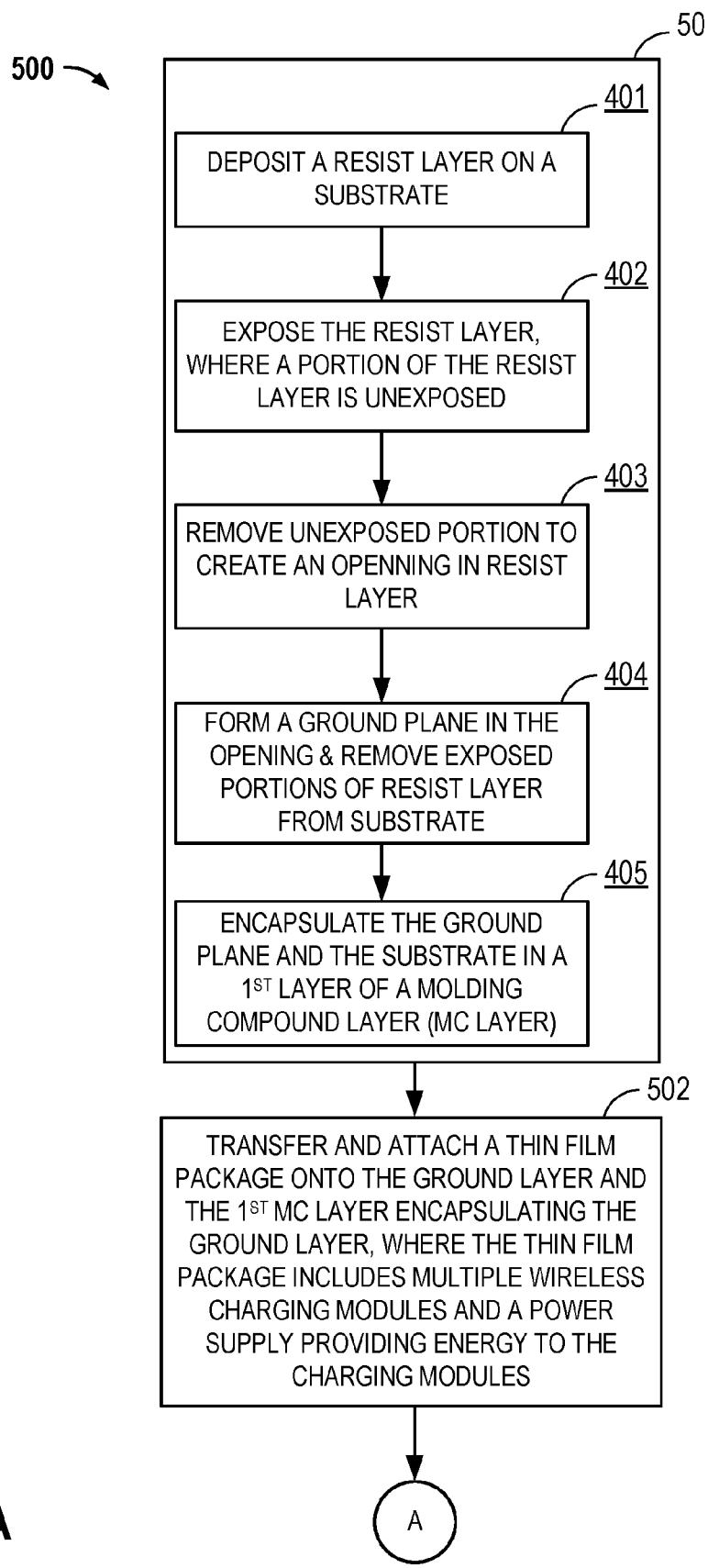
FIGS. 5A-5B are process flow illustrations of a method of forming an FFP, in accordance with another embodiment.
Figure 5B:
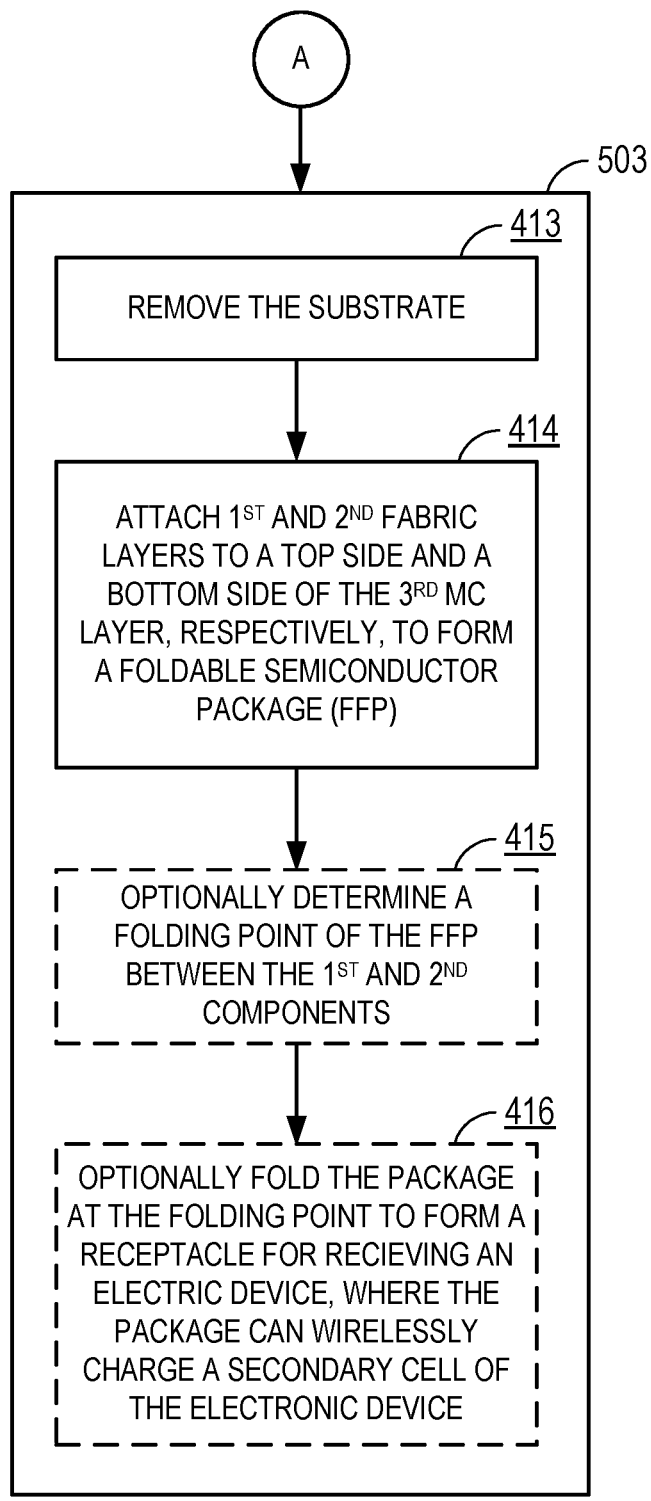

FIGS. 5A-5B are process flow illustrations of a method 500 of forming an FFP, in accordance with another embodiment. Process 500 begins at block 501, which includes all of the operations described above in connection with blocks 401-405 of FIG. 4A. At block 502, a thin film package 301 is transferred and attached onto the ground layer and the first MC layer encapsulating the ground layer. Block 502 can be performed as described above in connection with FIGS. 3A-3B. Process 500 ends at block 503, which includes all of the operations described above in connection with blocks 413-416 of FIG. 4C. Block 503 can be performed as described above in connection with FIGS. 3C-3E.

Figure 6:
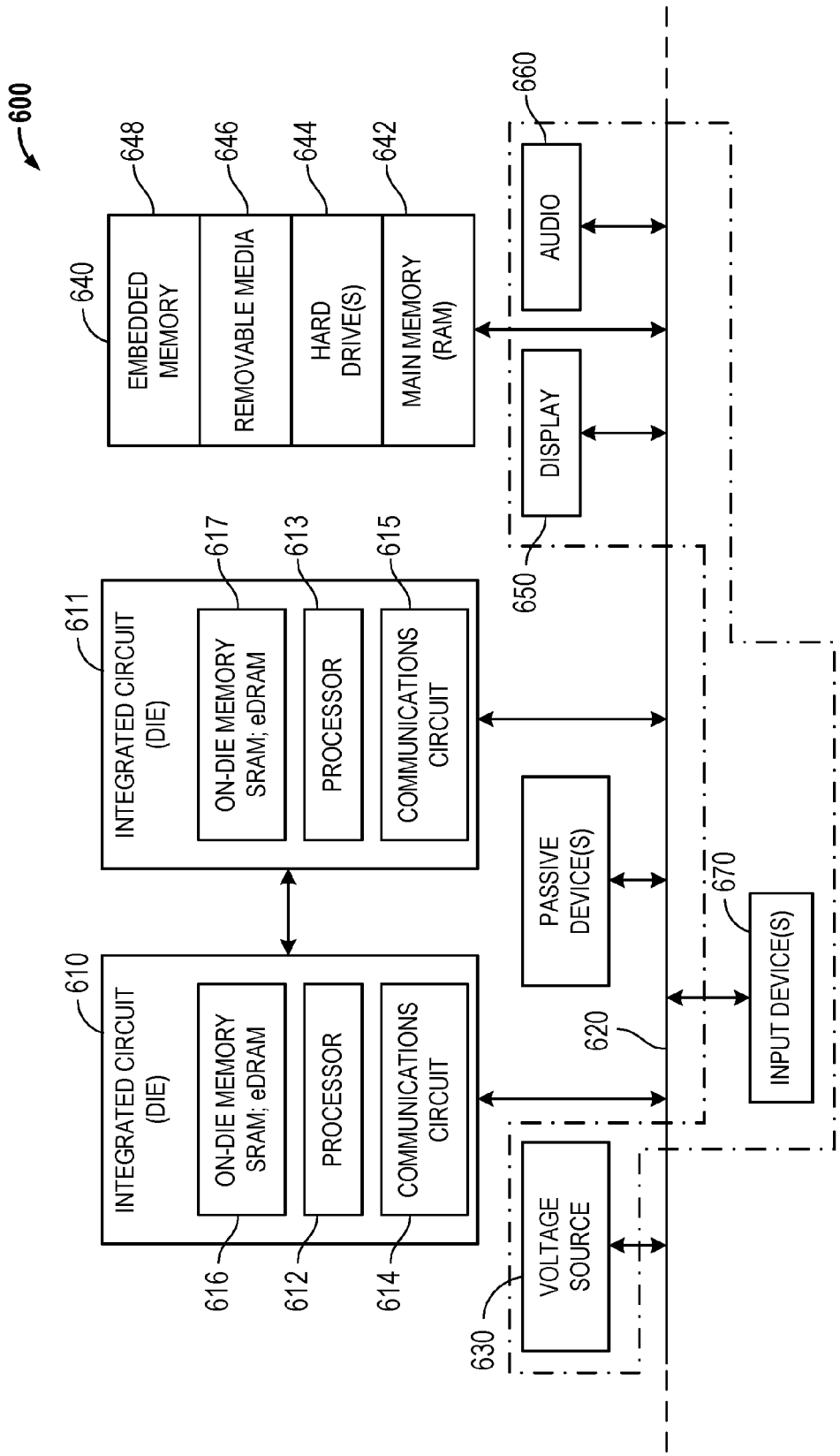
FIG. 6 is an illustration of a schematic block diagram of a computer system that utilizes an FFP, in accordance with an embodiment.

FIG. 6 is an illustration of a schematic block diagram of a computer system that utilizes an FFP, in accordance with an embodiment. The computer system 600 (also referred to as an electronic system 600) can include a semiconductor package (e.g., an FFP, etc.) in accord with any of the embodiments and their equivalents as set forth in this disclosure. The computer system 600 may be a mobile device such as a netbook computer. The computer system 600 may be a mobile device such as a wireless smart phone. The computer system 600 may be a desktop computer. The computer system 600 may be a hand-held reader. The computer system 600 may be a server system. The computer system 600 may be a supercomputer or high-performance computing system.

The electronic system 600 can be a computer system that includes a system bus 620 to electrically couple the various components of the electronic system 600. The system bus 620 is a single bus or any combination of busses according to various embodiments. The electronic system 600 includes a voltage source 630 that provides power to the integrated circuit 610. In some embodiments, the voltage source 630 supplies current to the integrated circuit 610 through the system bus 620.

The integrated circuit 610 is electrically coupled to the system bus 620 and includes any circuit, or combination of circuits according to an embodiment. For an embodiment, the integrated circuit 610 includes a processor 612 that can be of any type. As used herein, the processor 612 may mean any type of circuit such as, but not limited to, a microprocessor, a microcontroller, a graphics processor, a digital signal processor, or another processor. For an embodiment, the processor 612 includes, or is coupled with, a semiconductor package (e.g., an FFP, etc.), as described in the foregoing specification. For an embodiment, SRAM embodiments are found in memory caches of the processor. Other types of circuits that can be included in the integrated circuit 610 are a custom circuit or an application-specific integrated circuit (ASIC), such as a communications circuit 614 for use in wireless devices such as cellular telephones, smart phones, pagers, portable computers, two-way radios, and similar electronic systems, or a communications circuit for servers. For an embodiment, the integrated circuit 610 includes on-die memory 616 such as static random-access memory (SRAM). For an embodiment, the integrated circuit 610 includes embedded on-die memory 616 such as embedded dynamic random-access memory (eDRAM). For one embodiment, the on-die memory 616 may be packaged as or with a semiconductor package (e.g., an FFP, etc.), as described in the foregoing specification.

For an embodiment, the integrated circuit 610 is complemented with a subsequent integrated circuit 611. Useful embodiments include a dual processor 613 and a dual communications circuit 615 and dual on-die memory 617 such as SRAM. For an embodiment, the dual integrated circuit 610 includes embedded on-die memory 617 such as eDRAM.

For an embodiment, the electronic system 600 also includes an external memory 640 that in turn may include one or more memory elements suitable to the particular application, such as a main memory 642 in the form of RAM, one or more hard drives 644, and/or one or more drives that handle removable media 646, such as diskettes, compact disks (CDs), digital variable disks (DVDs), flash memory drives, and other removable media known in the art. The external memory 640 may also be embedded memory 648 such as the first die in a die stack, according to an embodiment.

For an embodiment, the electronic system 600 also includes a display device 650 and an audio output 660. For an embodiment, the electronic system 600 includes an input device such as a controller 670 that may be a keyboard, mouse, trackball, game controller, microphone, voice-recognition device, or any other input device that inputs information into the electronic system 600. For an embodiment, an input device 670 is a camera. For an embodiment, an input device 670 is a digital sound recorder. For an embodiment, an input device 670 is a camera and a digital sound recorder.

At least one of the integrated circuits 610 or 611 can be implemented in a number of different embodiments, including a semiconductor package (e.g., an FFP, etc.), according to any of the several embodiments and their equivalents, an electronic system, a computer system, one or more methods of fabricating an integrated circuit, and one or more methods of fabricating an electronic assembly that includes a semiconductor package (e.g., an FFP, etc.), according to any of the several disclosed embodiments as set forth herein in the various embodiments and their art-recognized equivalents. The elements, materials, geometries, dimensions, and sequence of operations can all be varied to suit particular I/O coupling requirements including array contact count, array contact configuration for a microelectronic die embedded in a processor mounting substrate according to any of the several disclosed semiconductor packages (e.g., FFPs, etc.), according to any of the several disclosed embodiments as set forth herein and their art-recognized equivalents. A foundation substrate may be included, as represented by the dashed line of FIG. 6. Passive devices may also be included, as is also depicted in FIG. 6.

Reference throughout this specification to "one embodiment," "an embodiment," "another embodiment," "specific embodiment," and their variations means that a particular feature, structure, configuration, or characteristic described in connection with the embodiment is included in at least one embodiment. Thus, the appearances of the phrase "for one embodiment," "for an embodiment," "for another embodiment," or their variations in various places throughout this specification are not necessarily referring to the same embodiment. Furthermore, the particular features, structures, configurations, or characteristics may be combined in any suitable manner in one or more embodiments. Furthermore, some operations in one or more embodiments of the process flows described herein (e.g., in at least one of FIGS. 1A, 1B, 2A-2L, 3A-3E, 4A-4C, and 5A-5B) may be omitted or performed in a sequence that is different from what is illustrated or described herein.

The terms "over," "to," "between," and "on" as used in the foregoing specification refer to a relative position of one layer with respect to other layers. One layer "over" or "on" another layer or bonded "to" or in "contact" with another layer may be directly in contact with the other layer or may have one or more intervening layers. One layer "between" layers may be directly in contact with the layers or may have one or more intervening layers.

The description provided above in connection with one or more embodiments of a semiconductor package (e.g., an FFP, etc.) may also be used for other types of IC packages and mixed logic-memory package stacks. In addition, the processing sequences used to form one or more embodiments of a semiconductor package (e.g., an FFP, etc.) may be compatible with both wafer level packages (WLP), and integration with surface mount substrates such as LGA, QFN, and ceramic substrates.

As stated earlier, each of the components described above in connection with FIGS. 1A, 1B, 2A-2L, 3A-3E, 4A-4C, 5A-5B, and 6 includes one or more semiconductor die. Further, each of the components described above in connection with FIGS. 1A, 1B, 2A-2L, 3A-3E, 4A-4C, 5A-5B, and 6 can be a non-stacked die component, a stacked die component, or a die block (where the die block can be a stacked die package or non-stacked die package). Each of the components described above in connection with FIGS. 1A, 1B, 2A-2L, 3A-3E, 4A-4C, 5A-5B, and 6 can include any one of active and passive electronic device components—e.g., transistors, memories, capacitors, resistors, optoelectronic devices, switches, interconnects, and any other electronic device components. Each of the components described above in connection with FIGS. 1A, 1B, 2A-2L, 3A-3E, 4A-4C, 5A-5B, and 6 can include a memory, a processor, a Platform Controller Hub (PCH), a Peripheral Component Interconnect (PCI), a Graphics Processing Unit (GPU), an on-chip system fabric, a network interface controller, a stacked component, a non-stacked component, a ball grid array (BGA) package, any other electronic component, or any combination thereof.

Generally, a die in the context of integrated circuits is a small block of semiconducting material, on which a functional circuit is fabricated. Typically, integrated circuits are produced on a wafer of electronic-grade silicon or other semiconductor, for example, Gallium Arsenide ("GaAs") using one of photolithography techniques known in the art. The wafer is typically cut ("diced") into many pieces, each containing a copy of the circuit. Each of these pieces can be called a die or a chip.

The die can be mounted on a flexible package substrate, such as molding compound layers described above in connection with FIGS. 2A-2L, 3A-3E, 4A-4C, and 5A-5B, using different techniques known in the art. For example, mounting die on the flexible package substrate can be performed using surface activated bonding (SAB), thermal compression bonding (TCB), wire bonding, a flip-chip connection, and any other technique known in the art. The die can be directly attached and/or embedded to the substrate using any technique known in the art. In another embodiment, the flexible package substrate or molding compound layers may function as the circuit board for the wearable device.

It is to be understood that the various embodiments shown in the Figures and described in connection with the Figures are illustrative representations and are not necessarily drawn to scale. Thus, various modifications and/or changes may be made without departing from the broader spirit and scope of the embodiments described in connection with the foregoing specification, abstract, and/or Figures.

For one embodiment, a semiconductor package (e.g., an FFP) includes: an electrically conductive ground plane; a first component over the ground plane, a second component adjacent to the ground plane, a third component adjacent to the second component; a molding compound encapsulating the ground plane, the first component, the second component, and the third component; a first fabric layer on a top side of the molding compound; and a second fabric layer on a bottom side of the molding compound. For one embodiment of the semiconductor package (e.g., an FFP), each of the first, second, and thirds components includes one or more semiconductor dies. For one embodiment of the semiconductor package (e.g., an FFP), each of the first and second components is to wirelessly transfer energy to a secondary cell of an electronic device. For one embodiment of the semiconductor package (e.g., an FFP), the third component is to transfer energy to each of the first and second components. For one embodiment, the ground plane is to shield against electromagnetic signals associated with the wireless charging of the secondary cell. For one embodiment of the semiconductor package (e.g., an FFP), the third component is electrically coupled to each of the first and second components. For a further embodiment, the third component is electrically coupled to each of the first and second components via physical connection mechanisms (e.g., an interconnect, a wire, etc.). For one embodiment, the molding compound includes one or more molding compound layers (MC layers).

For one embodiment of the semiconductor package (e.g., an FFP), a top side of the first component is substantially coplanar with the top side of the molding compound and bottom sides of the ground plane, the second component, and the third component are substantially coplanar with the bottom side of the molding compound. For one embodiment of the semiconductor package (e.g., an FFP), the molding compound covers all sides of the ground plane, the first component, the second component, and the third component. For one embodiment of the semiconductor package (e.g., an FFP), the molding compound does not cover all sides of the ground plane, the first component, the second component, and the third component. For one embodiment of the semiconductor package (e.g., an FFP), the molding compound covers at least one side of each of the ground plane, the first component, the second component, and the third component. For one embodiment of the semiconductor package (e.g., an FFP), the first component is directly over the ground plane, wherein the second component is laterally adjacent to the ground plane, and the third component is laterally adjacent to the second component.

For one embodiment of the semiconductor package (e.g., an FFP), each of the molding compound, the first fabric layer, and the second fabric layer is a foldable material. For one embodiment of the semiconductor package (e.g., an FFP), each of the first and second fabric layers is formed from a fabric material. A fabric material can be formed from at least one of naturally occurring fibers (e.g., animal fiber, plant fibers, combinations thereof, etc.) or man-made fibers (e.g., regenerated fibers, synthetic fibers, combinations thereof, etc.). Examples of fibers include, but are not limited to, cotton fibers, microfibers, polyester-based fibers, and any combinations thereof. For one embodiment of the semiconductor package (e.g., an FFP), the molding compound is formed from at least one of polyester (e.g., Mylar, etc.), polyimide (e.g., Kapton, etc.), aramid, fiberglass-epoxy composites, fiberglass-epoxy-silicone composites, poly siloxanes, epoxy resins, acrylates, Methyl methacrylate (e.g., poly methyl methacrylate), polyurethanes, benzocyclobutene (BCB), polyimide, polyamide, high-density polyethylene (HDPE), bismaleimide-triazine (BT) resins, liquid crystal polymer (LCP), or polydimethylsiloxane (PDMS).

For one embodiment of the semiconductor package (e.g., an FFP), the package further includes: a first adhesive layer between the first fabric layer and the top side of the molding compound; and a second adhesive layer between the second fabric layer and the bottom side of the molding compound. The first adhesive layer can adhesively attach the first fabric layer to the top side of the molding compound, while the second adhesive layer can adhesively attach the second fabric layer to the bottom side of the molding compound.

For one embodiment of the semiconductor package (e.g., an FFP), the package further includes: a fourth component adjacent to the third component. For one embodiment of the semiconductor package (e.g., an FFP), the fourth component is electrically coupled to at least one of the first, second, or third components. For one embodiment of the semiconductor package (e.g., an FFP), the fourth component includes one or more semiconductor dies. For one embodiment of the semiconductor package (e.g., an FFP), the fourth component is configured to display information regarding one or more operations performed by at least one of the first, second, or third components. For one embodiment of the semiconductor package (e.g., an FFP), the fourth component is at least one of a display device, an audio device, or a haptic device, where the fourth component is to communicate information about at least one of the first, second, or third components.

For some embodiments, a wearable includes a circuit board; and a semiconductor package (e.g., an FFP) coupled to the circuit board. For these embodiments of the wearable, the package can be similar to or the same as at least one of the embodiments of a package described above.

For one embodiment, a method of forming a semiconductor package (e.g., an FFP) includes: applying a resist layer on a substrate; exposing the resist layer, wherein a portion of the resist layer is unexposed; removing the unexposed portion of the resist layer to create an opening in the resist layer; forming a ground plane in the opening, and removing the exposed portions of the resist layer after the ground plane is formed; and encapsulating, in a first molding compound layer (MC layer), the ground plane and an area where the exposed portions of the resist layer used to be, wherein a molding compound includes at least the first MC layer, a second MC layer, and a third MC layer. For one embodiment of the method, each of the first, second, and third MC layers is formed from a dielectric material. For one embodiment of the method, the dielectric material includes at least one of polyester (e.g., Mylar, etc.), polyimide (e.g, Kapton, etc.), aramid, fiberglass-epoxy composites, fiberglass-epoxy-silicone composites, poly siloxanes, epoxy resins, acrylates, Methyl methacrylate (e.g., poly methyl methacrylate), polyurethanes, benzocyclobutene (BCB), polyimide, polyamide, high-density polyethylene (HDPE), bismaleimide-triazine (BT) resins, liquid crystal polymer (LCP), or polydimethylsiloxane (PDMS).

For one embodiment of the method, the method further includes: depositing the second MC layer on the first MC layer after the first MC layer encapsulates the ground plane and the resist layer; transferring a first component onto the second MC layer such that the first component is over the ground plane, forming a first cavity and a second cavity through the first and second MC layers. For one embodiment of the method, the first cavity and the second cavity are adjacent to the ground plane, and the first cavity is between the second cavity and the ground plane.

For one embodiment of the method, the method further includes: transferring a second component into the first cavity; transferring a third component into the second cavity, wherein the third component includes one or more semiconductor dies; and electrically coupling the third component to the first and second components via physical connection mechanisms. For one embodiment of the method, the method includes: encapsulating the first MC layer, the second MC layer, the ground plane, the first component, the second component, and the third component in the third MC layer.

For one embodiment of the method, each of the first, second, and third components includes one or more semiconductor dies. For one embodiment of the method, each of the first and second components is to wirelessly transfer energy to a secondary cell of an electronic device. For one embodiment of the method, the third component is to transfer energy to each of the first and second components. For one embodiment of the method, the ground plane is to shield against electromagnetic signals associated with the wireless charging of the secondary cell.

For one embodiment of the method, the method further includes: removing the substrate after the first MC layer, the second MC layer, the ground plane, the first component, the second component, and the third component are encapsulated in the molding compound; attaching, via a first adhesive layer, a first fabric layer to a top side of the molding compound; and attaching, via a second adhesive layer, a second fabric layer to a bottom side of the molding compound. For one embodiment of the method, each of the first and second fabric layers is attached after the substrate is removed. For one embodiment of the method, each of the first and second fabric layers is formed from at least one of naturally occurring fibers (e.g., animal fiber, plant fibers, combinations thereof, etc.) or man-made fibers (e.g., regenerated fibers, synthetic fibers, combinations thereof, etc.). Examples of fibers include, but are not limited to, cotton fibers, microfibers, polyester-based fibers, and any combinations thereof For one embodiment of the method, a top side of the first component is substantially coplanar with the top side of the molding compound and bottom sides of the ground plane, the second component, and the third component are substantially coplanar with the bottom side of the molding compound. For one embodiment of the method, the molding compound covers all sides of the ground plane, the first component, the second component, and the third component. For one embodiment of the method, the molding compound does not cover all sides of the ground plane, the first component, the second component, and the third component. For one embodiment of the method, the molding compound covers at least one side of each of the ground plane, the first component, the second component, and the third component.

For one embodiment of the method, the first component is directly over the ground plane, the second component is laterally adjacent to the ground plane, and the third component is laterally adjacent to the second component.

The terms used in the following claims should not be construed to limit any of the embodiments described in connection with the foregoing specification, abstract, and/or Figures to the specific embodiments set forth in the foregoing specification, abstract, Figures, and/or claims. Rather, the scope of the claims are to be construed in accordance with established doctrines of claim interpretation.

What is claimed is:

1. A semiconductor package comprising:
 an electrically conductive ground plane;
 a first component over the ground plane, the first component including one or more semiconductor dies;
 a second component adjacent to the ground plane, the second component including one or more semiconductor dies;
 a third component adjacent to the second component, the third component being electrically coupled to each of the first and second components, and the third component including one or more semiconductor dies;
 a molding compound encapsulating the ground plane, the first component, the second component, and the third component, wherein the molding compound includes one or more molding compound layers (MC layers);
 a first fabric layer on a top side of the molding compound; and
 a second fabric layer on a bottom side of the molding compound.

2. The package of claim 1, wherein a top side of the first component is substantially coplanar with the top side of the molding compound and wherein bottom sides of the ground plane, the second component, and the third component are substantially coplanar with the bottom side of the molding compound.

3. The package of claim 1, wherein the molding compound covers at least one side of each of the ground plane, the first component, the second component, and the third component.

4. The package of claim 1, wherein the first component is configured to wirelessly transfer energy to a secondary cell of an electronic device, wherein the second component is configured to wirelessly transfer energy to the secondary cell of the electronic device, wherein the third component is configured to transfer energy to each of the first and second components, and wherein the ground plane is configured to shield against electromagnetic signals associated with the wireless transfer of energy to the secondary cell.

5. The package of claim 1, wherein each of the molding compound, the first fabric layer, and the second fabric layer is a foldable material.

6. The package of claim 1, further comprising:
 a first adhesive layer between the first fabric layer and the top side of the molding compound, wherein the first adhesive layer adhesively attaches the first fabric layer to the top side of the molding compound; and
 a second adhesive layer between the second fabric layer and the bottom side of the molding compound, wherein the second adhesive layer adhesively attaches the second fabric layer to the bottom side of the molding compound.

7. The package of claim 1, wherein the first component is directly over the ground plane, wherein the second component is laterally adjacent to the ground plane, and the third component is laterally adjacent to the second component.

8. The package of claim 1, further comprising:
 a fourth component adjacent to the third component, the fourth component being electrically coupled to each of the first, second, and third components, and the fourth component including one or more semiconductor dies.

9. The package of claim 8, wherein the fourth component is configured as at least one of a display device, an audio device, or a haptic device, wherein the fourth component communicates information about at least one of the first, second, or third components.

10. A wearable comprising:
 a circuit board; and
 a semiconductor package coupled to the circuit board, the package including
 an electrically conductive ground plane;
 a first component over the ground plane, the first component including one or more semiconductor dies;
 a second component adjacent to the ground plane, the second component including one or more semiconductor dies;
 a third component adjacent to the second component, the third component being electrically coupled to each of the first and second components,
 and the third component including one or more semiconductor dies;
 a molding compound encapsulating the ground plane, the first component, the second component, and the third component, wherein the molding compound includes one or more molding compound layers (MC layers);
 a first fabric layer on a top side of the molding compound; and
 a second fabric layer on a bottom side of the molding compound.

11. The wearable of claim 10, wherein a top side of the first component is substantially coplanar with the top side of the molding compound and wherein bottom sides of the ground plane, the second component, and the third component are substantially coplanar with the bottom side of the molding compound.

12. The wearable of claim 10, wherein the molding compound covers at least one side of each of the ground plane, the first component, the second component, and the third component.

13. The wearable of claim 10, wherein the first component is configured to wirelessly transfer energy to a secondary cell of an electronic device, wherein the second component is configured to wirelessly transfer energy to the secondary cell of the electronic device, wherein the third component is configured to transfer energy to each of the first and second components, and wherein the ground plane is configured to shield against electromagnetic signals associated with the wireless transfer of energy to the secondary cell.

14. The wearable of claim 10, wherein each of the molding compound, the first fabric layer, and the second fabric layer is a foldable material.

15. The wearable of claim 10, wherein the package further comprises:
 a first adhesive layer between the first fabric layer and the top side of the molding compound, wherein the first adhesive layer adhesively attaches the first fabric layer to the top side of the molding compound; and
 a second adhesive layer between the second fabric layer and the bottom side of the molding compound, wherein the second adhesive layer adhesively attaches the second fabric layer to the bottom side of the molding compound.

16. The wearable of claim 10, wherein the first component is directly over the ground plane, wherein the second component is laterally adjacent to the ground plane, and the third component is laterally adjacent to the second component.

17. The wearable of claim 10, wherein the package further comprises:
   a fourth component adjacent to the third component, the fourth component being electrically coupled to each of the first, second, and third components, and the fourth component including one or more semiconductor dies, wherein the first component is configured to wirelessly transfer energy to a secondary cell of an electronic device, wherein the second component is configured to wirelessly transfer energy to the secondary cell of the electronic device, wherein the third component is configured to transfer energy to each of the first and second components, and wherein the ground plane is configured to shield against electromagnetic signals associated with the wireless transfer of energy to the secondary cell, and wherein the fourth component is configured to communicate information regarding one or more operations performed by at least one of the first, second, or third components.

* * * * *